(12) United States Patent
Yano et al.

(10) Patent No.: US 10,917,982 B2
(45) Date of Patent: Feb. 9, 2021

(54) METAL HOUSING AND VENTILATION STRUCTURE EMPLOYING SAME

(71) Applicant: NITTO DENKO CORPORATION, Ibaraki (JP)

(72) Inventors: Youzou Yano, Osaka (JP); Kou Uemura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 713 days.

(21) Appl. No.: 15/314,311

(22) PCT Filed: May 26, 2015

(86) PCT No.: PCT/JP2015/002668
§ 371 (c)(1),
(2) Date: Nov. 28, 2016

(87) PCT Pub. No.: WO2015/182131
PCT Pub. Date: Dec. 3, 2015

(65) Prior Publication Data
US 2017/0196105 A1    Jul. 6, 2017

(30) Foreign Application Priority Data
May 28, 2014   (JP) .................................. 2014-109858

(51) Int. Cl.
*B65D 81/26* (2006.01)
*H05K 5/02* (2006.01)
*H05K 5/04* (2006.01)

(52) U.S. Cl.
CPC ......... *H05K 5/0213* (2013.01); *B65D 81/263* (2013.01); *H05K 5/04* (2013.01)

(58) Field of Classification Search
CPC ..................................................... B65D 81/263
(Continued)

(56) References Cited

U.S. PATENT DOCUMENTS

| 5,914,415 A | 6/1999 | Tago |
| 6,364,924 B1 | 4/2002 | Mashiko et al. |

(Continued)

FOREIGN PATENT DOCUMENTS

| CN | 2924465 Y | 7/2007 |
| CN | 202951852 U | 5/2013 |

(Continued)

OTHER PUBLICATIONS

Masuko, Hiroaki, JP2001168543 Translation.pdf, "Ventilation Enclosure", Jun. 2001, pp. 1-16.*

(Continued)

*Primary Examiner* — Edelmira Bosques
*Assistant Examiner* — Ryan L Faulkner
(74) *Attorney, Agent, or Firm* — Sughrue Mion, PLLC

(57) ABSTRACT

A ventilation structure includes a metal housing and a ventilation member. The metal housing is a housing that requires ventilation, and has a ventilation hole and a hole-surrounding portion. The ventilation hole is covered by the ventilation member. The hole-surrounding portion defining the periphery of the ventilation hole has been subjected to an alumite treatment, a treatment for forming a chemical conversion coating formed by a trivalent chromium compound, a chromium-plating-on-aluminum treatment, or an oil-repellent treatment.

9 Claims, 5 Drawing Sheets

(58) Field of Classification Search
USPC .......................................................... 454/370
See application file for complete search history.

(56) References Cited

U.S. PATENT DOCUMENTS

| | | | |
|---|---|---|---|
| 6,994,621 | B2 | 2/2006 | Mashiko et al. |
| 9,120,059 | B2 | 9/2015 | Daimon et al. |
| 2010/0323281 | A1 | 12/2010 | Sekihara |
| 2013/0309109 | A1 | 11/2013 | Wu et al. |
| 2014/0042033 | A1 | 2/2014 | Schilz et al. |
| 2015/0208525 | A1 | 7/2015 | Negishi et al. |

FOREIGN PATENT DOCUMENTS

| | | | |
|---|---|---|---|
| CN | 203554130 U | | 4/2014 |
| JP | 10-085536 A | | 4/1998 |
| JP | 2001-143524 A | | 5/2001 |
| JP | 2001168543 A | * | 6/2001 |
| JP | 2004-47425 A | | 2/2004 |
| JP | 2004-055055 A | | 2/2004 |
| JP | 2004-506784 A | | 3/2004 |
| JP | 2008-113037 A | | 5/2008 |
| JP | 2008-223044 A | | 9/2008 |
| JP | 2011-2680 A | | 1/2011 |
| JP | 2012-231088 A | | 11/2012 |
| JP | 2013-254909 A | | 12/2013 |
| JP | 2014-72257 A | | 4/2014 |
| JP | 2015-003621 A | | 1/2015 |
| WO | 0216306 A2 | | 2/2002 |

OTHER PUBLICATIONS

Negishi, Yoshiku, JP2014072257 Translation.pdf, "Electronic Controller", Sep. 2012, pp. 1-17.*
International Search Report of PCT/JP2015/002668, dated Aug. 25, 2015. [PCT/ISA/210].
First Office Action dated Aug. 3, 2018, issued by the State Intellectual Property Office of People's Republic of China in corresponding Chinese Application 201580028121.
Technical Manual of Energy Saving and Emission Reduction in Equipment Manufacturing, First Volume, published on Aug. 31, 2013.
Reconsideration Report dated Nov. 24, 2020 by the Japanese Patent Office in application No. 2020-012316.

* cited by examiner

METAL HOUSING AND VENTILATION STRUCTURE EMPLOYING SAME

CROSS REFERENCE TO RELATED APPLICATIONS

This application is a National Stage of International Application No. PCT/JP2015/002668 filed May 26, 2015, claiming priority based on Japanese Patent Application No. 2014-109858, filed May 28, 2014, the contents of all of which are incorporated herein by reference in their entirety.

TECHNICAL FIELD

The present invention relates to a metal housing and a ventilation structure employing the metal housing.

BACKGROUND ART

Housings for containing electrical components such as a motor, sensor, switch, and electric control unit (ECU) are provided with a ventilation member. The ventilation member serves to maintain ventilation between the inside and outside of the housing, reduce the pressure change within the housing due to temperature change, and prevent the entry of foreign matters into the housing.

Such a ventilation member is attached to a housing so as to cover a ventilation hole (a hole for internal pressure control) formed in the housing, as described in Patent Literature 1 to 3. Specifically, a ventilation member described in Patent Literature 1 is attached to a nozzle-shaped portion provided in a housing. A ventilation member described in Patent Literature 2 is fitted in a ventilation hole formed in a housing. A seal ring is used to seal the gap between the ventilation member and the housing. A ventilation member described in Patent Literature 3 is attached to a housing with a double-faced adhesive tape so as to cover a ventilation hole.

CITATION LIST

Patent Literature

Patent Literature 1: JP 2001-143524 A
Patent Literature 2: JP 2004-47425 A
Patent Literature 3: JP 2013-254909 A

SUMMARY OF INVENTION

Technical Problem

Housings are made of resin or metal depending on their intended use. For example, housings made of metal are recommended when heat release properties are important. Housings may be placed in corrosive environments, in which, for example, they are exposed to salt-containing water or highly humid air. When a housing made of metal is placed in a corrosive environment, the housing gradually corrodes over time. If the corrosion reaches the contact interface (sealed interface) between the ventilation member and the housing, the sealing function at the contact interface can deteriorate. In addition, the corrosion can reach that surface of the housing which is in contact with an engaging portion of the ventilation member. This can also lead to the deterioration in sealing function. The deterioration in sealing function makes it easier for foreign matters such as water and dust to enter the inside of the housing, which can adversely affect an electrical or mechanical component disposed within the housing.

The present invention aims to provide a technique for preventing or retarding the decrease, caused by corrosion of a housing, in the protective function of the housing for an electrical or mechanical component.

Solution to Problem

That is, the present disclosure provides a metal housing that requires ventilation, the metal housing including:

a ventilation hole to be covered by a ventilation member; and a hole-surrounding portion defining the periphery of the ventilation hole, the hole-surrounding portion having being subjected to an alumite treatment, a Veluscudo treatment, a chromium-plating-on-aluminum treatment, or an oil-repellent treatment.

In another aspect, the present disclosure provides a metal housing component for use as a component of a metal housing that requires ventilation, the metal housing component including:

a ventilation hole to be covered by a ventilation member; and a hole-surrounding portion defining the periphery of the ventilation hole, the hole-surrounding portion having been subjected to an alumite treatment, a Veluscudo treatment, a chromium-plating-on-aluminum treatment, or an oil-repellent treatment.

In another aspect, the present disclosure provides a ventilation structure including:

the metal housing or the metal housing component as defined above; and a ventilation member attached to the metal housing or the metal housing component so as to cover the ventilation hole.

Advantageous Effects of Invention

A metal housing or a metal housing component according to the present disclosure has a hole-surrounding portion having been subjected to a predetermined treatment for increasing corrosion resistance. It is thus possible to prevent or retard the decrease, caused by corrosion of the housing, in the protective function of the housing for an electrical or mechanical component.

DESCRIPTION OF EMBODIMENTS

Hereinafter, embodiments of the present invention will be described with reference to the drawings. The present invention is not limited to the embodiments described below.

First Embodiment

Figure 1:
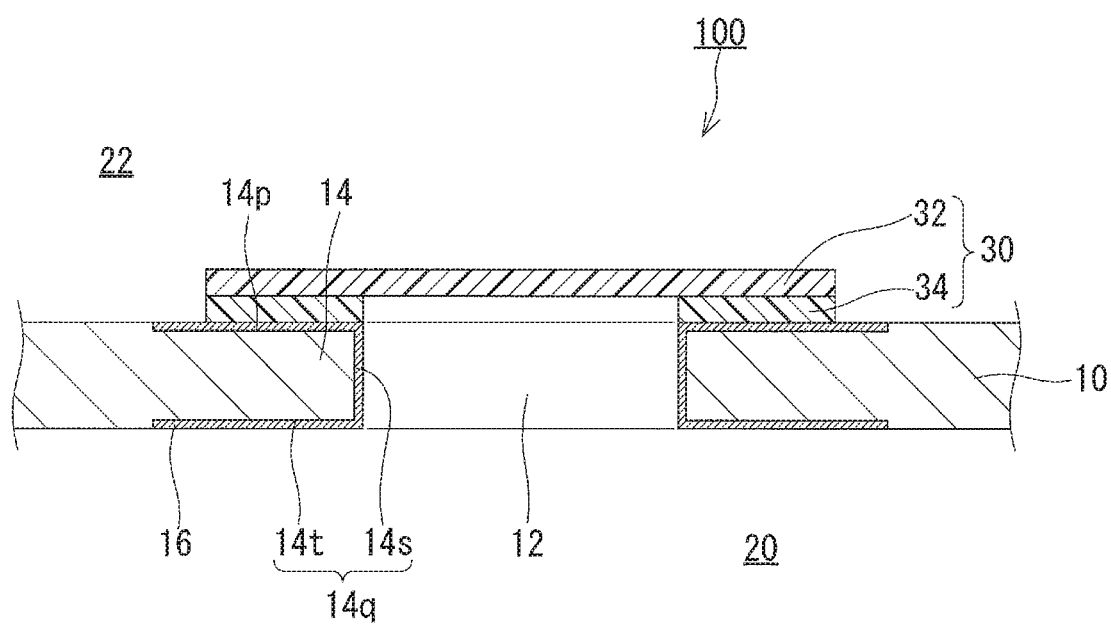
FIG. 1 is a cross-sectional view of a ventilation structure according to the first embodiment.

A ventilation structure 100 according to the first embodiment includes a metal housing 10 and a ventilation member 30, as shown in FIG. 1. The metal housing 10 has a ventilation hole 12 for providing ventilation between an internal space 20 and an external space 22. The internal space 20 is a space for containing an electrical or mechanical component to be protected. The ventilation hole 12 is covered by the ventilation member 30. FIG. 1 shows only a part of the metal housing 10.

In the present embodiment, the ventilation member 30 has a gas-permeable membrane 32 and an adhesive layer 34. The adhesive layer 34 is provided on a surface of the gas-permeable membrane 32. The adhesive layer 34 is, for example, ring-shaped in plan view. That is, the gas-permeable membrane 32 is adhered to a hole-surrounding portion 14 of the metal housing 10 via the adhesive layer 34. The ventilation member 30 has the advantage of consisting of a small number of components, being inexpensive, and not requiring a wide space.

The gas-permeable membrane 32 can be a membrane having the property of allowing passage of gases and preventing passage of liquids. The material of the gas-permeable membrane 32 is not particularly limited, and may be a resin or metal. The form of the gas-permeable membrane 32 is not particularly limited either, and the membrane may be in the form of a woven fabric, non-woven fabric, mesh, net, or the like. The gas-permeable membrane 32 typically has a porous resin membrane and a reinforcing layer. Examples of the material of the porous resin membrane include a porous material of fluororesin and porous material of polyolefin that can be produced by a commonly-known stretching or extraction technique. Examples of the fluororesin include polytetrafluoroethylene (PTFE), polychlorotrifluoroethylene, tetrafluoroethylene-hexafluoropropylene copolymer, and tetrafluoroethylene-ethylene copolymer. Examples of the monomer constituting the polyolefin include ethylene, propylene, and 4-methylpentene-1,1-butene. A polyolefin obtained by homopolymerization or copolymerization of these monomers can be used. Alternatively, a porous nanofiber film formed using polyacrylonitrile, nylon, or polylactic acid can be used. Among the above materials, a porous PTFE material is preferred since it can exhibit high gas permeability while having a small area and is superior in preventing the entry of foreign matters into the metal housing 10. An example of the reinforcing layer is a non-woven fabric made of a resin such as polyethylene. The gas-permeable membrane 32 does not need to have the reinforcing layer and may have a layer other than the reinforcing layer. The porous resin membrane and/or reinforcing layer may be subjected to a liquid-repellent treatment depending on the intended use of the metal housing 10.

The adhesive layer 34 may consist only of an adhesive agent or may be a double-faced adhesive tape obtained by applying an adhesive agent to both surfaces of a substrate. The type of the adhesive agent is not particularly limited. For example, an acrylic adhesive agent can be used. The term "adhesive agent" as used herein is intended to encompass a pressure-sensitive adhesive.

The metal housing 10 is typically made of aluminum or an aluminum alloy. Aluminum or aluminum alloys are lightweight, inexpensive, have good heat release properties, and are thus suitable as the material of the metal housing 10. Aluminum or aluminum alloys form a natural oxide film and thus exhibit high corrosion resistance in air. However, aluminum or aluminum alloys are vulnerable to acids and alkalis, in particular chlorine ions. Thus, the technique disclosed herein is highly effective also when the metal housing 10 is made of aluminum or an aluminum alloy. Aluminum alloys that can be suitably used include aluminum alloys for aluminum die casting, such as ADC12 and AC4B-F. It should be noted that the material of the metal housing 10 is not particularly limited. The technique disclosed herein is applicable to any housing made of a corrodible metal material. That is, the metal housing 10 may be made of any of metal materials such as iron and stainless steel.

In general, the metal housing 10 is constituted by a plurality of components. The metal housing 10 is constituted, for example, by an upper component (first component) and a lower component (second component), and the ventilation hole 12 is formed in at least one of the upper and lower components (at least one selected from the plurality of components).

As shown in FIG. 1, the metal housing 10 has the hole-surrounding portion 14 defining the periphery of the ventilation hole 12. The hole-surrounding portion 14 has been subjected to a predetermined treatment for increasing corrosion resistance. The predetermined treatment for increasing corrosion resistance is an alumite treatment, a Veluscudo treatment, a chromium-plating-on-aluminum treatment, or an oil-repellent treatment. Any of these treatments results in the formation of a corrosion-resistant coating 16 on the hole-surrounding portion 14. The corrosion-resistant coating 16 can prevent or retard corrosion of the hole-surrounding portion 14. It is consequently possible to prevent or retard the decrease, caused by corrosion of the metal housing 10, in the function of protecting a component disposed within the metal housing 10.

Specifically, the hole-surrounding portion 14 of the metal housing 10 includes a seal-forming surface $14p$ and an internal surface $14q$ as its surfaces. The seal-forming surface $14p$ is a part of the external surface of the metal housing 10 and is a surface that is to contact a component of the ventilation member 30 (the adhesive layer 34 in the present embodiment) to form a sealed interface therebetween. The internal surface $14q$ is contiguous to the seal-forming surface $14p$ and exposed to the atmosphere of the internal space 20. The internal surface $14q$ is formed by an inner peripheral surface $14s$ of the ventilation hole 12 and an inward surface $14t$ opposite to the seal-forming surface $14p$. In the present embodiment, the corrosion-resistant coating 16 is formed on the seal-forming surface $14p$ and the internal surface $14q$. This can prevent or retard the progress of corrosion of the hole-surrounding portion 14. In particular, the presence of the corrosion-resistant coating 16 formed on the seal-forming surface $14p$ can prevent the adhesive strength of the adhesive layer 34 from decreasing due to corrosion of the hole-surrounding portion 14. In addition, the presence of the corrosion-resistant coating 16 formed on the internal surface $14q$ can prevent formation of rust or deposition of salts such as sodium chloride and calcium chloride from occurring on the inner peripheral surface $14s$ of the ventilation hole 12 due to corrosion of the metal housing 10. It is also possible to prevent foreign matters such as rust and salts from falling on an electrical or mechanical component disposed within the metal housing 10.

It should be noted that the deterioration in sealing function caused by corrosion of the metal housing 10 can be prevented or retarded insofar as the corrosion-resistant coating 16 is formed at least on the seal-forming surface 14$p$. The corrosion-resistant coating 16 may be formed only on the internal surface 14$q$.

The ventilation member 30 may be disposed within the metal housing 10. That is, the space denoted by the reference character "22" may be the internal space of the metal housing 10, while the space denoted by the reference character "20" may be the external space outside the metal housing 10. The surface denoted by the reference character "14$q$" may be the surface (external surface) exposed to the atmosphere outside the metal housing 10.

Next, the treatments for forming the corrosion-resistant coating 16 will be described.

(Alumite Treatment)

The alumite treatment is also called "anodizing". Anodizing of a housing made of aluminum or an aluminum alloy can form an anodic oxide coating (alumite) serving as the corrosion-resistant coating 16. As is well-known to persons skilled in the art, the anodizing can be accomplished, for example, by the following procedures. First, a housing made of aluminum or an aluminum alloy is placed on the anode side in an electrolyte solution such as sulfuric acid while a lead plate is placed on the cathode side. A current is applied between the anode and cathode, with the result that oxygen evolved at the anode and aluminum chemically react to form a thick, porous oxide coating. Additionally, the housing is treated with high-temperature, high-pressure steam or hot water to close the pores of the oxide coating. As a result, an anodic oxide coating having high corrosion resistance, weather resistance, and contamination resistance can be obtained. The anodic oxide coating thus obtained is significantly thicker than natural oxide films.

(Veluscudo Treatment)

The Veluscudo treatment is a treatment for forming a chemical conversion coating made of a trivalent chromium compound on the surface of aluminum or an aluminum alloy (such as ADC12, A1100, A2017, and A5052). The chemical conversion coating formed by the Veluscudo treatment has high corrosion resistance.

The Veluscudo treatment can be a trivalent chromium chemical conversion treatment performed on the surface of a housing made of aluminum or an aluminum alloy. The chemical conversion coating formed by the trivalent chromium chemical conversion treatment may be free of any hexavalent chromium compound. Various trivalent chromium chemical conversion treatment solutions for carrying out the trivalent chromium chemical conversion treatment are commercially available. Typical trivalent chromium chemical conversion treatment solutions contain: a $Cr^{3+}$ salt, such as $CrCl_3$ and $Cr(NO_3)_3$, as a main component; a catalyst component such as a nitric acid salt; and an organic acid such as oxalic acid, malonic acid, and citric acid. Some trivalent chromium chemical conversion treatment solutions contain a silicate compound such as colloidal silica and an additive such as a fluoride. Furthermore, there is also a trivalent chromium chemical conversion treatment solution to which a cobalt salt beneficial to the improvement in corrosion resistance has been added.

The trivalent chromium chemical conversion treatment can be carried out by bringing a housing made of aluminum or an aluminum alloy into contact with a trivalent chromium chemical conversion treatment solution (the contact is made by immersion, spraying, application, or the like). The conditions of the trivalent chromium chemical conversion treatment differ from those of a well-known chromate treatment (chemical conversion treatment using a treatment solution containing hexavalent chromate ions as a main component) in that the chromium concentration is higher, the pH is higher (1.8 to 2.2), the treatment time is longer (about 1 minute), and the treatment temperature is higher (30 to 60° C.) in the trivalent chromium chemical conversion treatment than in the well-known chromate treatment. However, the basic processes in the trivalent chromium chemical conversion treatment are identical to those in the conventional chromate treatment.

(Chromium-Plating-On-Aluminum Treatment)

The chromium-plating-on-aluminum treatment is a treatment for forming a coating (plating) having a thickness of about 10 to 30 μm, including an undercoat, on the surface of a housing made of aluminum or an aluminum alloy. The coating formed by the chromium-plating-on-aluminum treatment has high corrosion resistance.

The chromium-plating-on-aluminum treatment can be a treatment for forming a hexavalent chromium plating on an undercoat. The hexavalent chromium plating can be formed using any of commonly-known chromium plating baths such as a Sargent bath, a fluoride-containing bath, a high-speed bath, a hard chromium bath, and a bath for high corrosion resistance. A zinc plating can be formed as the undercoat on the surface of the housing made of aluminum or an aluminum alloy, and then the hexavalent chromium plating can be formed on the undercoat. A pretreatment such as degreasing, etching, and acid immersion may be performed before the formation of the undercoat. A zinc coating can be formed as the undercoat using a zincate conversion treatment solution containing sodium hydroxide and zinc oxide.

(Oil-Repellent Treatment)

The oil-repellent treatment is a treatment for forming an oil-repellent coating serving as the corrosion-resistant coating 16. The oil-repellent coating can be formed, for example, from a polymer material. Specifically, the oil-repellent coating can be formed by applying an oil-repellent agent containing a polymer having a perfluoroalkyl group to the metal housing according to a predetermined method. Examples of the method for applying the oil-repellent agent to the metal housing include air spraying, electrostatic spraying, dip coating, spin coating, roll coating, curtain flow coating, and impregnation. The oil-repellent agent can be a solution or dispersion of the polymer. The oil-repellent coating can be formed, in some cases, by a coating formation technique such as electrodeposition coating and plasma polymerization. That is, the method for forming the oil-repellent coating is not particularly limited. The oil-repellent treatment is advantageous in that it is applicable to any metal housing irrespective of the metal of which the housing is made.

Hereinafter, ventilation structures according to different embodiments will be described. The elements common between the ventilation structure 100 shown in FIG. 1 and the embodiments described below are denoted by the same reference characters, and the description of such elements may be omitted. That is, the description of each embodiment is applicable to the other embodiments unless technical inconsistency occurs. Furthermore, the features of the embodiments may be combined with each other unless technical inconsistency occurs.

Second Embodiment

Figure 2A:
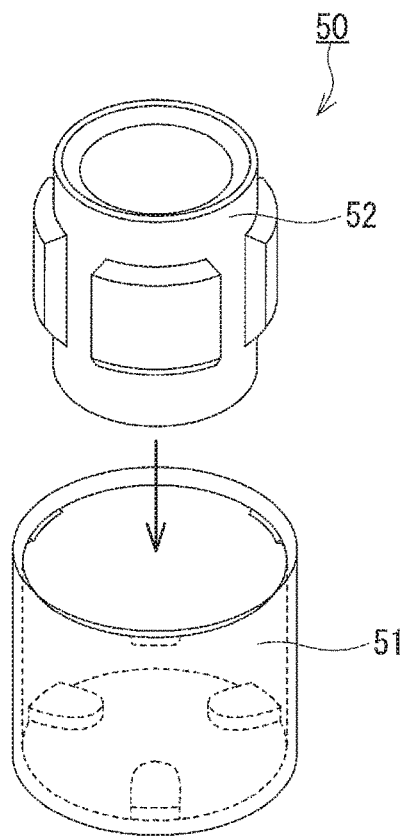
FIG. 2A is an exploded perspective view of a ventilation member used in a ventilation structure according to the second embodiment.
Figure 2B:
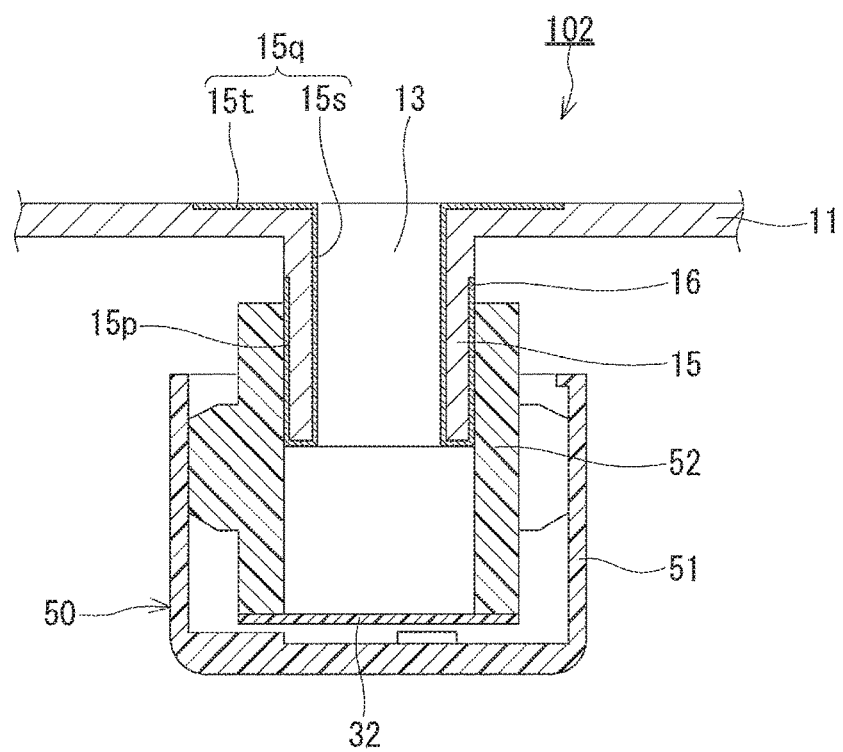
FIG. 2B is a cross-sectional view of the ventilation structure according to the second embodiment.

A ventilation structure 102 according to the second embodiment includes a metal housing 11 and a ventilation member 50, as shown in FIG. 2A and FIG. 2B. The ventilation member 50 is constituted by a cover 51, a tubular body 52, and the gas-permeable membrane 32. The cover 51 is a tubular component having a bottom. The material of the cover 51 is not particularly limited. The cover 51 may be made of any of thermoplastic resins such as polyamide, polyethylene terephthalate, polyphenylene sulfide, polybutylene terephthalate, polycarbonate, polypropylene, and modified polyphenylene ether, may be made of any of thermosetting resins such as nitrile rubber, ethylene propylene rubber, silicone rubber, fluorine rubber, acrylic rubber, and hydrogenated nitrile rubber, or may be made of a metal. The tubular body 52 may be made of any of elastomers such as olefinic thermoplastic elastomers and styrenic thermoplastic elastomers or may be made of any of the thermosetting resins as mentioned above. The gas-permeable membrane 32 is attached to the tubular body 52 so as to cover an opening of the tubular body 52. The outer diameter of the tubular body 52 is slightly smaller than the inner diameter of the cover 51. The tubular body 52 is fitted in the cover 51 so that the gas-permeable membrane 32 is protected by the cover 51. A gas passage is formed between the inner peripheral surface of the cover 51 and the outer peripheral surface of the tubular body 52, and a gas passage is formed between the bottom surface of the cover 51 and the surface of the gas-permeable membrane 32.

The metal housing 11 has a nozzle-shaped portion 15 as the hole-surrounding portion. The nozzle-shaped portion 15 defines a ventilation hole 13. In the ventilation structure 102, the nozzle-shaped portion 15 is inserted in the tubular body 52. The ventilation member 50 is attached to the metal housing 11 by means of the elasticity of the tubular body 52. According to the present embodiment, the gas-permeable membrane 32 is protected by the cover 51, thanks to which the gas-permeable membrane 32 has a low likelihood of suffering from adherence of foreign matters or being damaged.

The nozzle-shaped portion 15 has an outer peripheral surface 15p and an inner peripheral surface 15s as its surfaces. The outer peripheral surface 15p of the nozzle-shaped portion 15 is a surface (seal-forming surface) that is to contact a component of the ventilation member 50 (the tubular body 52 in the present present embodiment) to form a sealed interface therebetween. The inner peripheral surface 15s is the inner peripheral surface not only of the nozzle-shaped portion 15 but also of the ventilation hole 13. The inner peripheral surface 15s of the nozzle-shaped portion 15 is continuous to an inward surface 15t of the housing 11. The inner peripheral surface 15s of the nozzle-shaped portion 15 and the inward surface 15t of the housing 11 together form an internal surface 15q.

In the present embodiment, the corrosion-resistant coating 16 is formed on the outer peripheral surface 15p of the nozzle-shaped portion 15, on the inner peripheral surface 15s of the nozzle-shaped portion 15, and on the inward surface 15t of the housing 11. This can prevent or retard the progress of corrosion of the nozzle-shaped portion 15. The presence of the corrosion-resistant coating 16 formed on the outer peripheral surface 15p of the nozzle-shaped portion 15 can prevent the close fitting between the nozzle-shaped portion 15 and the tubular body 52 from being impaired by corrosion of the nozzle-shaped portion 15. As is the case for the first embodiment, the corrosion-resistant coating 16 may be formed only on the outer peripheral surface 15p of the nozzle-shaped portion 15. The corrosion-resistant coating 16 may be formed only on the inner peripheral surface 15s of the nozzle-shaped portion 15. The corrosion-resistant coating 16 may be formed only on the internal surface 15q. It should be understood that the corrosion-resistant coating 16 may be formed over the entire metal housing 11.

Third Embodiment

Figure 3:
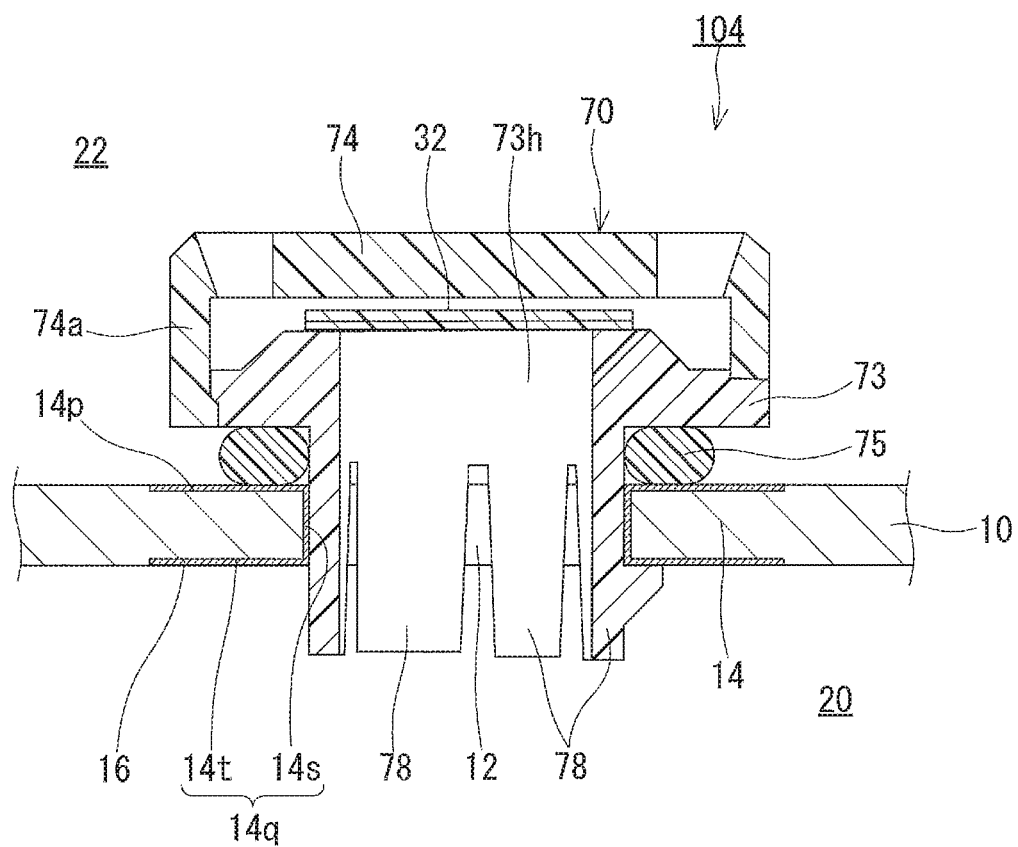
FIG. 3 is a cross-sectional view of a ventilation structure according to the third embodiment.

A ventilation structure 104 according to the third embodiment includes the metal housing 10 and a ventilation member 70, as shown in FIG. 3. The ventilation member 70 includes a support 73, the gas-permeable membrane 32, a cover 74, and a seal ring 75 (O-ring). The cover 74 has a plurality of claw portions 74a. The claw portions 74a engage with outer edges of the support 73 so that the cover 74 is secured to the support 73. The gas-permeable membrane 32 is enclosed and protected by the cover 74. The support 73 has a through hole 73h functioning as a gas passage. The cover 74 and the support 73 are each made of, for example, a thermoplastic resin, similar to the cover 51 described in the second embodiment. The gas-permeable membrane 32 is disposed on the support 73 so as to cover the through hole 73h. The gas-permeable membrane 32 may be adhered or welded to the support 73. Additionally, the support 73 has a plurality of leg portions 78 extending in a length direction of the through hole 73h (in a downward direction). The plurality of leg portions 78 are inserted in the ventilation hole 12 and engage with the hole-surrounding portion 14 of the metal housing 10. The seal ring 75 is a component made of an elastomer. The seal ring 75 is attached to the leg portions 78 (to the bases of the leg portions 78). In the ventilation structure 104, the seal ring 75 is disposed between an under surface of the support 73 and the outward surface (seal-forming surface) of the metal housing 10. The seal ring 75 seals the gap between the support 73 and the metal housing 10. In this manner, the ventilation member 70 is attached to the metal housing 10. According to the present embodiment, the gas-permeable membrane 32 is protected by the cover 74, thanks to which the gas-permeable membrane 32 has a low likelihood of suffering from adherence of foreign matters or being damaged. Furthermore, the ventilation member 70 does not easily comes off the metal housing 10.

The metal housing 10 in the ventilation structure 104 of the present embodiment is identical to the metal housing 10 in the ventilation structure 100 of the first embodiment. That is, also in the present embodiment, the corrosion-resistant coating 16 is formed on the hole-surrounding portion 14. The present embodiment thus provides the same effect as the first embodiment. In particular, the presence of the corrosion-resistant coating 16 formed on the seal-forming surface 14p can maintain the sealing function performed by the seal ring 75 over a long period of time.

The plurality of leg portions 78 of the ventilation member 70 engage with the inward surface 14t of the metal housing 10. Thus, the O-ring 75 is held between the under surface of the support 73 and the seal-forming surface 14p of the metal housing 10. If the corrosion of the metal housing 10 advances to the inner peripheral surface 14s of the ventilation hole 12 and to the inward surface 14t, the engagement between the plurality of leg portions 78 of the ventilation member 70 and the inward surface 14t will become unstable. This will result in a slight increase in the distance between the under surface of the support 73 and the seal-forming surface 14p of the metal housing 10 and hence a decrease in the sealing performance offered by the O-ring 75. It is thus desirable that, when the ventilation member 70 shown in FIG. 3 is used, the corrosion-resistant coating 16 be formed not only on the seal-forming surface 14p but also on the internal surface 14q, in particular on the inward surface 14s.

The effect of maintaining the sealing function can be obtained insofar as the corrosion-resistant coating 16 is formed on the internal surface 14q, in particular on the inward surface 14s.

Fourth Embodiment

Figure 4:
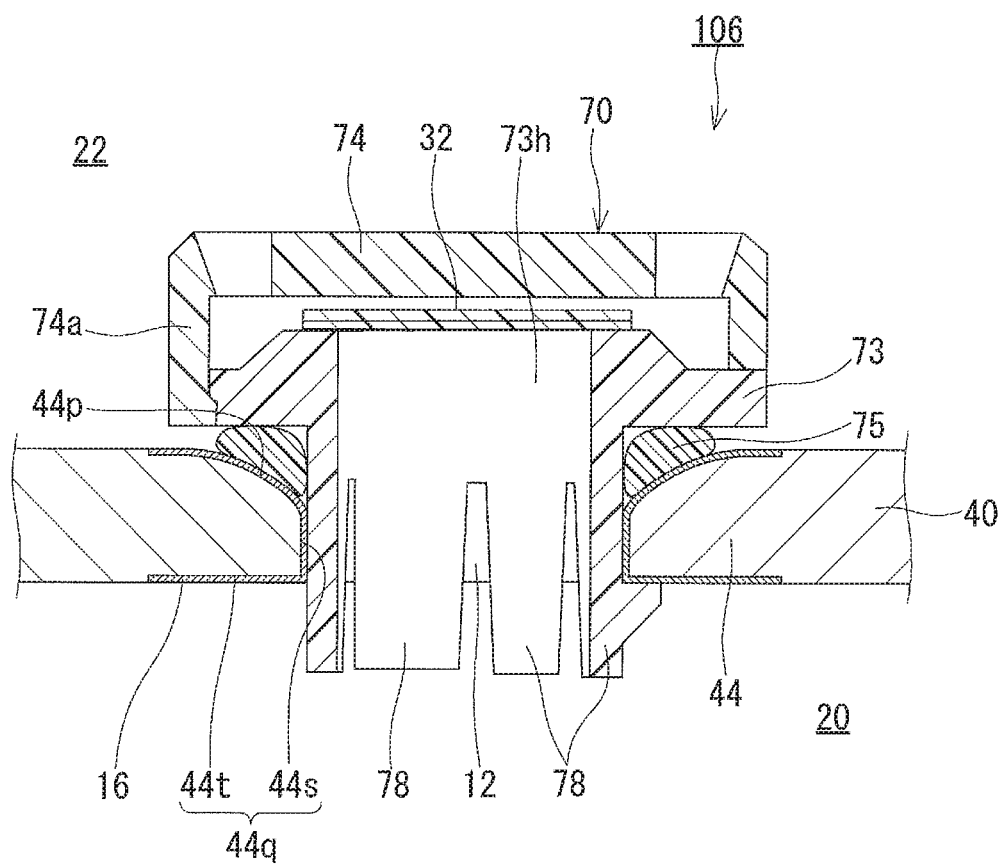
FIG. 4 is a cross-sectional view of a ventilation structure according to the fourth embodiment.

A ventilation structure 106 according to the fourth embodiment differs from the ventilation structure 104 of the third embodiment (FIG. 3) in that, as shown in FIG. 4, the ventilation structure 106 employs a metal housing 40 having a hole-surrounding portion 44 of tapered shape. The configuration of the ventilation member 70 is as described in the third embodiment.

The hole-surrounding portion 44 of the metal housing 40 includes a seal-forming surface 44p and an internal surface 44q as its surfaces. The seal-forming surface 44p is the surface of that part of the hole-surrounding portion 44 around which the cross-sectional area (opening area) of the ventilation hole 12 continuously increases with increasing distance from the internal space 20 of the metal housing 40. As described in the first embodiment, the internal surface 44q is formed by an inner peripheral surface 44s of the ventilation hole 12 and an inward surface 44t. A part or the whole of the seal ring 75 is located inside the ventilation hole 12. The hole-surrounding portion 44 of tapered shape is expected to improve the sealing performance offered by the seal ring 75.

Also in the present embodiment, the corrosion-resistant coating 16 is formed on the seal-forming surface 44p and the internal surface 44q. The present embodiment thus provides the same effect as the first embodiment. In particular, the presence of the corrosion-resistant coating 16 formed on the seal-forming surface 44p can maintain the sealing function performed by the seal ring 75 over a long period of time.

Fifth Embodiment

Figure 5:
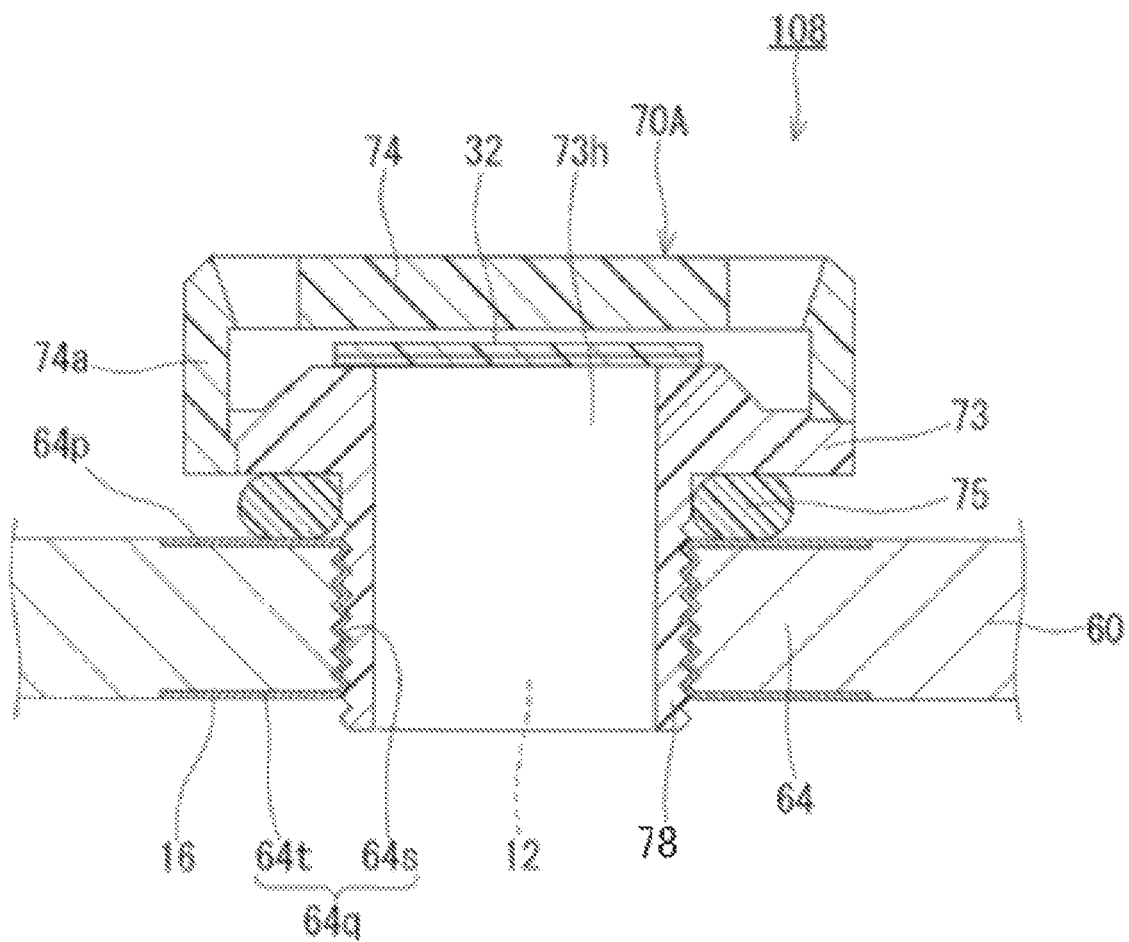
FIG. 5 is a cross-sectional view of a ventilation structure according to the fifth embodiment.

A ventilation structure 108 according to the fifth embodiment differs from the ventilation structures of the third and fourth embodiments in that, as shown in FIG. 5, the ventilation structure 108 includes a ventilation member 70A attached to a metal housing 60 by a screw connection. Specifically, the support 73 of the ventilation member 70A has a leg portion 78 that is hollow and cylindrical. A thread (male thread) is formed on the outer peripheral surface of the leg portion 78. A thread (female thread) is formed also on the inner peripheral surface of the ventilation hole 12 of the metal housing 60. The leg portion 78 of the support 73 is inserted in the ventilation hole 12. Specifically, the leg portion 78 of the support 73 is screwed into the ventilation hole 12. The ventilation member 70A is thus secured to the metal housing 60.

A hole-surrounding portion 64 of the metal housing 60 includes a seal-forming surface 64p and an internal surface 64q as its surfaces. The seal-forming surface 64p and internal surface 64q correspond to the seal-forming surface 14p and internal surface 14q described in the first embodiment, respectively. Also in the present embodiment, the corrosion-resistant coating 16 is formed on the seal-forming surface 64p and the internal surface 64q. The present embodiment thus provides the same effect as the first embodiment. In particular, the presence of the corrosion-resistant coating 16 formed on the seal-forming surface 64p can maintain the sealing function performed by the seal ring 75 over a long period of time. In the present embodiment, the corrosion-resistant coating 16 is formed also on the threaded surface (the inner peripheral surface 64s of the ventilation hole 12). It is not necessary to form the corrosion-resistant coating 16 on the threaded surface.

As can be understood from the first to fifth embodiments, the technique as described herein is applicable to any type of ventilation members. The embodiments can be combined with each other where appropriate. For example, the ventilation structure 106 of the fourth embodiment and the ventilation structure 108 of the fifth embodiment can be combined together. That is, the hole-surrounding portion 64 of the metal housing 60 in the fifth embodiment may have a seal-forming surface of tapered shape.

In the metal housing 10 described with reference to FIG. 1, the corrosion-resistant coating 16 is formed only on the hole-surrounding portion 14. However, the corrosion-resistant coating 16 may be formed over the entire metal housing 10. This applies to the metal housings of the other embodiments.

EXAMPLES

Example 1

First, a housing component (upper component) made of an aluminum alloy (ADC12) and having a ventilation hole was prepared. The whole of this housing component was subjected to the alumite treatment. A ventilation member as described with reference to FIG. 1 (S-NTF2131A-S06, manufactured by Nitto Denko Corporation) was adhered to the housing component so as to cover the ventilation hole. In this manner, a ventilation structure of Example 1 was obtained.

Examples 2 to 4 and Comparative Examples 1 to 4

Housing components identical to that of Example 1 were subjected to the treatments as shown in Table 1, and a ventilation member as described with reference to FIG. 1 was attached to each housing component. In this manner, ventilation structures of Examples 2 to 4 and Comparative Examples 1 to 4 were obtained. The oil-repellent treatment in Example 4 was carried out in the same manner as in Examples 5 to 7 described later. A housing component not subjected to any particular treatment was used in the ventilation structure of Comparative Example 1. The lubricating plating treatment in Comparative Example 3 is a treatment for forming an electroless nickel plating using a plating solution containing fine PTFE particles. The zircon treatment in Comparative Example 4 is a treatment for forming a chemical conversion coating made of a zirconium compound on the surface of a housing component made of aluminum or an aluminum alloy.

[Water Entry Pressure Test]

The ventilation structures of Examples 1 to 4 and Comparative Examples 1 to 4 were tested for water entry pressure. Specifically, water pressures were applied to the ventilation member from the inside of the housing, and the water pressure causing water leakage was determined. The result is shown in Table 1. The water entry pressure was 150 kPa for all of the ventilation structures.

[Salt Spray Test]

Next, the ventilation structures of Examples 1 to 3 and Comparative Examples 1 to 4 were subjected to a salt spray test. Specifically, a combined cyclic corrosion test (CCT) in accordance with JASO M609-91 (JIS H 8502) was carried out. For the test, a salt spray-drying-wetting combined cyclic test instrument manufactured by Suga Test Instruments Co., Ltd. was used. One cycle of the test consisted of a 2-hour salt spray step, a 4-hour drying step, and a 2-hour wetting step. The conditions of the steps were as follows.

Salt spray conditions: Temperature of 35±1° C., Sodium chloride concentration of 5±0.5%

Drying conditions: Temperature of 60±1° C.

Wetting conditions: Temperature of 50±1° C., Relative humidity of 95% RH or higher The salt spray test was performed with 150 cycles, after which the appearance of each ventilation structure was visually observed. A ventilation structure in which almost no corrosion occurred was rated as "⊚", a ventilation structure in which slight corrosion occurred was rated as "○", and a ventilation structure in which severe corrosion occurred was rated as "x". The result is shown in Table 1.

Furthermore, the ventilation structures subjected to the salt spray test were tested for water entry pressure in the same manner as in the water entry pressure test performed prior to the salt spray test. The result is shown in Table 1.

TABLE 1

| | Treatment | Water entry pressure measured before salt spray test (kPa) | Water entry pressure measured after salt spray test (kPa) | Appearance |
|---|---|---|---|---|
| Example 1 | Alumite | 150 | 120 | ○ |
| Example 2 | Veluscudo | 150 | 150 | ⊚ |
| Example 3 | Chromium-plating-on-aluminum | 150 | 150 | ⊚ |
| Example 4 | Oil repellent | 150 | 120 | ○ |
| Comparative Example 1 | — | 150 | 0 | X |
| Comparative Example 2 | Electroless nickel plating | 150 | 0 | X |
| Comparative Example 3 | Lubricating plating | 150 | 0 | X |
| Comparative Example 4 | Zircon | 150 | 0 | X |

As shown in Table 1, each of the ventilation structures of Examples 1 to 4 subjected to the alumite treatment, Veluscudo treatment, chromium-plating-on-aluminum treatment, or oil-repellent treatment underwent only a low degree of corrosion of the housing, and yielded a high water entry pressure even after the salt spray test. By contrast, the ventilation structures of Comparative Examples 1 to 4 suffered from such a high degree of corrosion of the housing that the water entry pressure was zero for all of the ventilation structures of Comparative Examples 1 to 4.

Example 5

A housing component identical to that of Example 1 was prepared, and the oil-repellent treatment was performed only on the seal-forming surface as described with reference to FIG. 1. Specifically, a fluororesin (Teflon AF (registered trademark) manufactured by Du Pont-Mitsui Fluorochemicals Company, Ltd.) was dissolved in a solvent (Fluorinert (registered trademark) manufactured by Mitsui 3M Ltd.) at a concentration of 3 wt % to obtain an oil-repellent agent for the oil-repellent treatment. The oil-repellent agent obtained was applied only to the seal-forming surface of the housing component. After that, a ventilation member as described with reference to FIG. 3 (Z3-NTF210SE, manufactured by Nitto Denko Corporation) was fitted in the ventilation hole. In this manner, a ventilation structure of Example 5 was obtained.

Example 6, Example 7, and Comparative Example 5

The oil-repellent treatment was performed on different sites of housing components identical to that of Example 5 as shown in Table 2, and a ventilation member as described with reference to FIG. 3 was fitted in the ventilation hole of each housing component. In this manner, ventilation structures of Example 6, Example 7, and Comparative Example 5 were obtained. A housing component not subjected to any particular treatment was used in the ventilation structure of Comparative Example 5.

[Salt Spray Test]

The ventilation structures of Examples 5 to 7 and Comparative Example 5 were subjected to the salt spray test previously described. The salt spray test was performed with 150 cycles, after which water pressures were applied to the ventilation member from the inside of the housing, and the water pressure causing water leakage was determined. The result is shown in Table 2. In the ventilation members used in the ventilation structures of Examples 5 to 7 and Comparative Example 5, the gas-permeable membrane was firmly secured to the support by welding. Thus, the application of a water pressure (500 kPa) to the ventilation member from the inside of the housing did not cause the gas-permeable membrane to peel from the support.

TABLE 2

| | Site subjected to oil-repellent treatment | Water entry pressure measured after salt spray test (kPa) |
|---|---|---|
| Example 5 | Seal-forming surface | 500 or more |
| Example 6 | Internal surface of housing | 500 or more |
| Example 7 | Entire surfaces of housing | 500 or more |
| Comparative Example 5 | — | 120 |

The ventilation structures of Examples 5 to 7 did not suffer from water leakage even when exposed to a water pressure of 500 kPa. By contrast, the ventilation structure of Comparative Example 5 suffered from water leakage when exposed to a water pressure of 120 kPa.

The ventilation members were detached from the ventilation structures, and the states of the vicinities of the ventilation holes were visually observed. There was no rust formed and no salt deposited on the seal-forming surfaces of the housing components used in the ventilation structures of Examples 5 and 7. There was a slight amount of rust formed on the seal-forming surface of the housing component used in the ventilation structure of Example 6. There was no rust formed and no salt deposited on the inner peripheral surfaces of the ventilation holes, and the inward surfaces, of the housing components used in the ventilation structures of Examples 5 to 7. By contrast, there was white rust formed on the seal-forming surface, the inner peripheral surface of the ventilation hole, and the inward surface, of the metal housing used in the ventilation structure of Comparative Example 5.

Furthermore, the alumite treatment, the Veluscudo treatment, and the chromium-plating-on-aluminum treatment were performed instead of the oil-repellent treatment on different sites (see Table 2) of housing components, and ventilation members were attached to the housing components to obtain ventilation structures. The water entry pressure was 500 kPa or more for all of these ventilation structures after the salt spray test.

INDUSTRIAL APPLICABILITY

The metal housing of the present invention can be used as a housing for automobile components such as a lump, motor, sensor, switch, ECU, and gearbox. The metal housing of the present invention can be suitably used not only as a housing for automobile components but also as a housing that is used to contain an electrical or mechanical component such as an electronic bulletin board and road sign and that requires internal pressure control.

The invention claimed is:

1. A metal housing component for use as a component of a metal housing that requires ventilation, the metal housing component comprising:
    a ventilation hole; and
    a hole-surrounding portion defining the periphery of the ventilation hole,
    wherein the hole-surrounding portion comprises a seal-forming surface that is to contact a seal ring of a ventilation member to form a sealed interface therebetween, and
    the seal-forming surface has been subjected to an alumite treatment, a treatment for forming a chemical conversion coating formed by a trivalent chromium compound, or a chromium-plating-on-aluminum treatment.

2. A ventilation structure comprising:
    the metal housing component according to claim 1; and
    the ventilation member attached to the metal housing component so as to cover the ventilation hole.

3. The ventilation structure according to claim 2, wherein the ventilation member comprises a gas-permeable membrane and an adhesive layer provided on a surface of the gas-permeable membrane, and
    the gas-permeable membrane is adhered to the hole-surrounding portion via the adhesive layer.

4. The ventilation structure according to claim 2, wherein the ventilation member comprises a tubular body made of an elastomer and a gas-permeable membrane attached to an opening portion of the tubular body,
    the hole-surrounding portion of the metal housing component is in the shape of a nozzle, and
    the ventilation member is attached to the metal housing component in such a manner that the hole-surrounding portion is inserted in the tubular body.

5. The ventilation structure according to claim 2, wherein the ventilation member comprises: a support having a through hole as a gas passage and a leg portion; a gas-permeable membrane disposed on the support so as to cover the through hole; and a seal ring attached to the leg portion of the support, and
    the ventilation member is attached to the metal housing component in such a manner that the leg portion of the support is inserted in the ventilation hole of the metal housing component and that the seal ring seals a gap between the support and the metal housing component.

6. A ventilation structure comprising:
    a metal housing having a ventilation hole and a hole-surrounding portion defining the periphery of the ventilation hole; and
    a ventilation member attached to the metal housing so as to cover the ventilation hole,
    wherein the ventilation member comprises: a support having a through hole as a gas passage and a leg portion; a gas-permeable membrane disposed on the support so as to cover the through hole; and a seal ring attached to the leg portion of the support,
    the ventilation member is attached to the metal housing in such a manner that the leg portion of the support is inserted in the ventilation hole of the metal housing and that the seal ring seals a gap between the support and the metal housing,
    the hole-surrounding portion comprises a seal-forming surface that is to contact the seal ring of the ventilation member to form a sealed interface therebetween and an internal surface,
    the internal surface comprises an inner peripheral surface of the ventilation hole and an inward surface opposite to the seal-forming surface,
    the leg portion of the support engages with the inward surface, and
    the seal-forming surface and the internal surface have been subjected to an alumite treatment, a treatment for forming a chemical conversion coating formed by a trivalent chromium compound, or a chromium-plating-on-aluminum treatment.

7. The ventilation structure according to claim 6, wherein the ventilation member comprises the gas-permeable membrane and an adhesive layer provided on a surface of the gas-permeable membrane, and
    the gas-permeable membrane is adhered to the hole-surrounding portion via the adhesive layer.

8. The ventilation structure according to claim 6, wherein the ventilation member comprises a tubular body made of an elastomer and a gas-permeable membrane attached to an opening portion of the tubular body,
    the hole-surrounding portion of the metal housing is in the shape of a nozzle, and
    the ventilation member is attached to the metal housing in such a manner that the hole-surrounding portion is inserted in the tubular body.

9. The ventilation structure according to claim 6, wherein the metal housing is made of aluminum or an aluminum alloy.

* * * * *